US 6,697,909 B1

(12) United States Patent
Wang et al.

(10) Patent No.: US 6,697,909 B1
(45) Date of Patent: Feb. 24, 2004

(54) METHOD AND APPARATUS FOR PERFORMING DATA ACCESS AND REFRESH OPERATIONS IN DIFFERENT SUB-ARRAYS OF A DRAM CACHE MEMORY

(75) Inventors: Li-Kong Wang, Montvale, NJ (US); Louis L. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 09/660,431

(22) Filed: Sep. 12, 2000

(51) Int. Cl.[7] .................. G06F 13/00; G06F 13/18; G11C 11/406
(52) U.S. Cl. .................. 711/106; 711/5; 711/158; 711/168; 365/222
(58) Field of Search .................. 711/106, 5, 133, 711/150, 151, 158, 159, 168; 365/222, 230.03

(56) References Cited

U.S. PATENT DOCUMENTS

| 5,091,846 | A |   | 2/1992  | Sachs et al. ............ 711/130 |
|-----------|---|---|---------|----------------------------------|
| 5,469,555 | A |   | 11/1995 | Ghosh et al. ............ 711/133 |
| 5,469,559 | A |   | 11/1995 | Parks et al. ............ 711/106 |
| 5,577,223 | A |   | 11/1996 | Tanoi et al. ............ 711/118 |
| 5,596,521 | A | * | 1/1997  | Tanaka et al. ............ 365/49 |
| 5,829,026 | A |   | 10/1998 | Leung et al. ............ 711/122 |
| 5,835,401 | A |   | 11/1998 | Green et al. ............ 365/149 |
| 5,940,342 | A |   | 8/1999  | Yamazaki et al. ...... 365/230.03 |
| 5,963,497 | A | * | 10/1999 | Holland ............ 365/222 |
| 5,966,725 | A | * | 10/1999 | Tabo ............ 711/106 |
| 6,028,804 | A | * | 2/2000  | Leung ............ 365/222 |
| 6,167,484 | A | * | 12/2000 | Boyer et al. ............ 711/106 |
| 6,285,616 | B1 | * | 9/2001 | Ikabata ............ 365/222 |
| 6,389,505 | B1 | * | 5/2002 | Emma et al. ............ 711/106 |
| 6,415,353 | B1 | * | 7/2002 | Leung ............ 711/106 |
| 6,445,636 | B1 | * | 9/2002 | Keeth et al. ............ 365/222 |

FOREIGN PATENT DOCUMENTS

JP           6-068671        *  3/1994

* cited by examiner

Primary Examiner—Glenn Gossage
(74) Attorney, Agent, or Firm—Robert M. Trepp; Frank V. DeRosa

(57) ABSTRACT

A method and apparatus for refreshing data in a dynamic random access memory (DRAM) cache memory in a computer system are provided to perform a data refresh operation without refresh penalty (e.g., delay in a processor). A data refresh operation is performed with respect to a DRAM cache memory by detecting a request address from a processor, stopping a normal refresh operation when the request address is detected, comparing the request address with TAG addresses stored in a TAG memory, generating refresh addresses to refresh data stored in the cache memory, each of which is generated based on an age of data corresponding to the refresh address, and performing a read/write operation on a wordline accessed by the request addresses and refreshing data on wordlines accessed by the refresh addresses, wherein the read/write operation and the refreshing of data are performed simultaneously.

17 Claims, 4 Drawing Sheets

METHOD AND APPARATUS FOR PERFORMING DATA ACCESS AND REFRESH OPERATIONS IN DIFFERENT SUB-ARRAYS OF A DRAM CACHE MEMORY

BACKGROUND OF THE INVENTION

1. Field of the Invention

The present invention relates to cache memory in a computer system, and more particularly to a method and apparatus for refreshing dynamic random access memory (DRAM) cache memory without refresh penalty.

2. Description of the Related Art

In a general computer system, a memory hierarchy exists to support a central processing unit (CPU) with data storage capability. A type of memory device used most frequently as main memory in computers is dynamic random access memory (DRAM). This is because DRAM is comparatively low cost and high in density, facilitating storage of large quantities of data in a small area of a computer system. However, data stored in DRAM must be refreshed periodically, or otherwise the data will be lost due to charge leakage from DRAM cells. What is traded off is a higher cost in system overhead needed to refresh data in DRAMs and a speed penalty caused thereby.

When it is necessary to interface a fast processor with a slower memory, the overall system speed is slowed because the processor cycle time is faster than the data access time of the memory. One way to handle such a situation is to use higher-speed embedded cache memory to decrease the effective time to access the slower memory (i.e., main memory of a computer system).

Cache memories are buffers that hold selected data from larger and usually slower main memory so that processors can fetch needed data from the selected data more rapidly. Cache memory is based on the principle that certain data has a higher probability at any given time of being selected next by a processor than other data. If the data of higher probability to be used by the processor is stored in cache memory with a faster access time, then the average speed to access the data will be increased. Thus, cache memory, which is usually smaller and faster than main memory, is used to store the most frequently accessed data of the main memory.

In the memory hierarchy of modem computer processing systems, cache memory is generally located immediately below the highest level processor, i.e., central processing unit (CPU). Typically, the cache memory is divided into multiple levels, for example, level one (L1) cache and level two (L2) cache. Some of the levels (e.g., level one (L1) cache) may be on the same chip as the CPU, thus referred to as "on-chip". Such an on-chip cache memory is generally configured with static random access memory (SRAM) which has lower density but higher speed. Other levels of cache memory (e.g., level two (L2) cache ) may be located separately from the CPU and configured with DRAM which has higher density but lower speed. A larger size cache memory can be provided by using high density DRAM as cache memories of processors in a computer system, so that 'cache miss rate' (this is explained in detail below) can be reduced.

Since data stored in DRAMs are destroyed after being idle for a period of time, DRAMs require refresh cycles to restore the data in DRAMs. Memory cells in DRAMs must be periodically refreshed within a certain period of time. This time period is referred to as "retention time". Depending on the technology and chip temperature, the retention time may vary in the range of a few milli-seconds to hundreds of milli-seconds. Data refresh is accomplished by accessing each row in memory arrays, one row at a time. When the memory arrays are accessed to be refreshed, data stored in memory cells of the arrays are read to sense-amplifiers, and immediately written back to the memory cells. A capacitor corresponding to each memory cell is thus recharged to its initial value. Such required refresh cycles in DRAMs cause significant delay due to inaccessibility of data in the DRAM while rows of the memory arrays are in the middle of refresh cycles. In other words, during the time that memory cells of DRAM cache memory are refreshed, no other operation can take place in that area of the memory. This "dead time" slows down the effective speed of accessing data in memories in a computer system. Although data refresh time may be reduced by using higher quality capacitors for memory cells in cache memory, requirement of data refresh is still a significant factor causing delay in the timing of a computer system.

U.S. Pat. No. 6,028,804 to Leung proposes a solution to the above problem. Leung describes a method for operating a peak frequency of DRAM cache memory higher than a peak external access frequency of the CPU. The refresh cycles for the DRAM refresh operation may be hidden, so that the memory system appears to the outside world like SRAM. However, a drawback in such a conventional system is that DRAM cache memory employed in such a conventional computer system must be able to operate faster than the CPU, which is practically very difficult and, if practical, requires high cost.

Therefore, an improved method of refreshing data stored in DRAM cache memory is needed for eliminating excess delay.

OBJECTS AND SUMMARY OF THE INVENTION

It is an object of the present invention to provide a method and apparatus for refreshing data in a cache memory in a computer system without refresh penalty.

To achieve the above and other objects, the present invention provides a method for refreshing data in a cache memory which is accessed by a processor in a computer system, wherein the method comprises the steps of: (a) verifying a request address made by the processor with TAG addresses stored in the cache memory; (b) accessing a wordline corresponding to the request address in one of a plurality of sub-arrays of the cache memory, when the request address is verified in step (a); (c) generating refresh addresses to refresh data in the plurality of sub-arrays other than the one sub-array in the cache memory, wherein each of the refresh addresses addresses a corresponding wordline in each of the plurality of sub-arrays other than the one sub-array; and (d) performing read/write operation on the wordline accessed by the request address in the one sub-array, while data in the plurality of sub-arrays other than the one sub-array are refreshed. The read/write operation with respect to the one sub-array and refreshing data in the plurality of sub-arrays other than the one sub-array are preferably performed simultaneously. The step (a) of the above method may include the steps of storing TAG addresses in a TAG memory, each TAG address being associated with a corresponding wordline data stored in the cache memory; comparing the request address with the TAG addresses; and selecting a TAG address identical with the request address. The step (c) of the above method may include the steps of providing data refresh timing of the plurality of sub-arrays other than the one sub-array in the cache memory by tracking wordlines of the one sub-array, and resetting the data refresh timing of the plurality of sub-arrays other than the one sub-array when data in the one sub-array is refreshed. For example, the refresh timing may be provided by a refresh counter. The refresh counter tracks the wordline addresses for each sub-array to be refreshed. When one wordline data is refreshed, the refresh counter generates the next address of the sub-array for refresh. When all the wordlines in the sub-array are refreshed, the refresh counter will reset to zero and starts to refresh the first wordline again in the next refresh cycle.

The present invention also provides an apparatus for refreshing data in a cache memory accessible by a processor in a computer system, wherein the apparatus comprises a memory controller for detecting a request address made by the processor; a comparator for comparing the request address detected by the memory controller with addresses associated with data stored in the cache memory; and a refresh controller for generating refresh addresses to refresh data stored in the cache memory when the comparator finds an address identical with the request address, wherein the request address accesses a wordline in a first sub-array of the cache memory and each of the refresh addresses accesses a corresponding wordline in each of sub-arrays other than the first sub-array. The comparator preferably receives TAG addresses from a TAG memory in the cache memory, and each of the TAG addresses is associated with a portion of data stored in a data memory of the cache memory. The refresh controller of the present invention preferably includes refresh address generators for generating the refresh addresses. Each refresh address generator may be associated with each of the sub-arrays other than the first sub-array to generate a refresh address to refresh data stored in a corresponding one of the sub-arrays other than the first sub-array, and may also include a refresh counter for providing refresh timing for a corresponding one of the sub-arrays other than the first sub-array. The refresh counter may reset the refresh timing to an initial value when data in a sub-array associated with the refresh counter is refreshed.

These and other objects, features and advantages of the present invention will become apparent from the following detailed description of illustrative embodiments thereof, which is to be read in connection with the accompanying drawings.

BRIEF DESCRIPTION OF THE DRAWINGS

This disclosure will present in detail the following description of preferred embodiments with reference to the following figures wherein.

DESCRIPTION OF PREFERRED EMBODIMENTS

Detailed illustrative embodiments of the present invention are disclosed herein. However, specific structural and functional details disclosed herein are merely representative for purposes of describing preferred embodiments of the present invention. The same refresh concept can be applied to any dynamic random access memory (DRAM) for any cache level.

One type of cache memory useful for a computer system which includes a large size main memory is an "associative cache memory". An associative cache memory includes two types of memories: data memory and TAG memory. Data memory stores cache lines which are fixed-size regions (e.g., wordlines) of main memory, and TAG memory (or directory memory) stores addresses of cache lines stored in the data memory.

Figure 1:
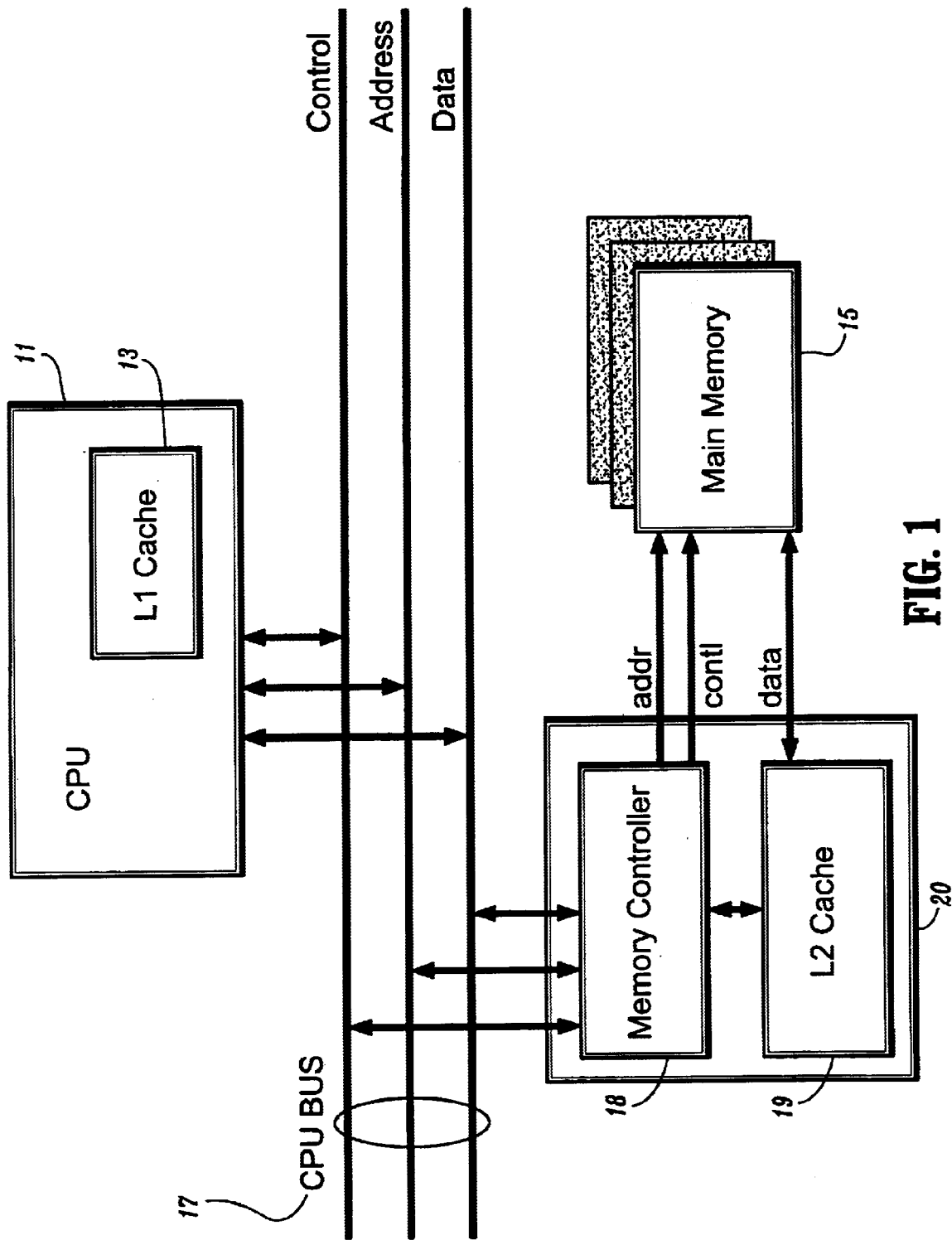
FIG. 1 is a block diagram of a memory configuration in a computer system where preferred embodiments of the present invention are applied.

Referring to FIG. 1, there is provided a block diagram illustrating a memory organization of a computer system according to the present invention. The computer system includes a central processing unit (CPU) 11 with an "on-chip" cache memory (L1 Cache) 13, a main memory 15, CPU bus 17, a memory controller 18 for controlling data traffic on the CPU bus 17, and a second level cache memory (L2 Cache)19.

The first level cache memory 13 is integrated on the same chip with the CPU 11. The first level cache memory 13 is faster because it is integrated with the CPU 11 with a higher bandwidth and shorter wire length and therefore avoids any delay associated with transmitting and/or receiving signals to and/or from an external chip. The second level cache memory 19 is located on a different chip 20 than the CPU 11, and has a larger capacity than the first level cache memory 13 but smaller than the main memory 15.

The cache memories 13, 19 serve as buffers between the CPU 11 and the main memory 15. In each of the cache memories 13, 19, data words are stored in a cache memory and are grouped into small pages called 'cache blocks' or 'cache lines'. The contents of the cache memory are a copy of a set of main memory blocks. Each cache line is marked with a "TAG address" that associates the cache line with a corresponding part of the main memory. Tag addresses (which may be non-continuous) assigned to the corresponding cache lines are stored in a special memory, called a "TAG" memory or "directory".

In the first level cache memory 13, when an address is requested by the CPU 11 to access certain data, the requested address is compared to TAG addresses stored in a TAG memory of the first level cache memory 13. If the requested address is found among the TAG addresses in the TAG memory, it is determined that data corresponding to the requested address is present in the cache memory 13, which is referred to as a "hit". Upon finding the data of the requested address in the cache memory 13, the data is transferred to the CPU 11. The TAG memory may also contain an offset address to locate the data in the cache memory 13. Locating data in a cache memory is well known in the art, thus a detailed description thereof is omitted herein.

On the other hand, if the requested address is not found in the TAG memory of the cache memory 13, it is determined that the data corresponding to the requested address is not present in the cache memory 13, which is referred to as a "miss". When a "miss" occurs in the first level cache memory 13, the requested address is sent to a lower level memory, for example, the second level cache memory 19. The data access process in the second level cache memory is described in detail below. If a "miss" occurs in the second level cache memory 19 (i.e., the data is not present in the second level cache memory), the requested address is sent to a third level cache memory (if available) or a main memory.

In FIG. 1, since the computer system preferably employs a SRAM for the first level cache memory 13 and a DRAM for the second level cache memory 19, no data refresh process is required for the first level cache memory 13. Thus, a method of refreshing data according to the present invention is described with respect to the second level cache memory 19. However, it should be noted that the present invention applies to any DRAM cache memory used in a hierarchical memory system to support main memory.

Figure 2:
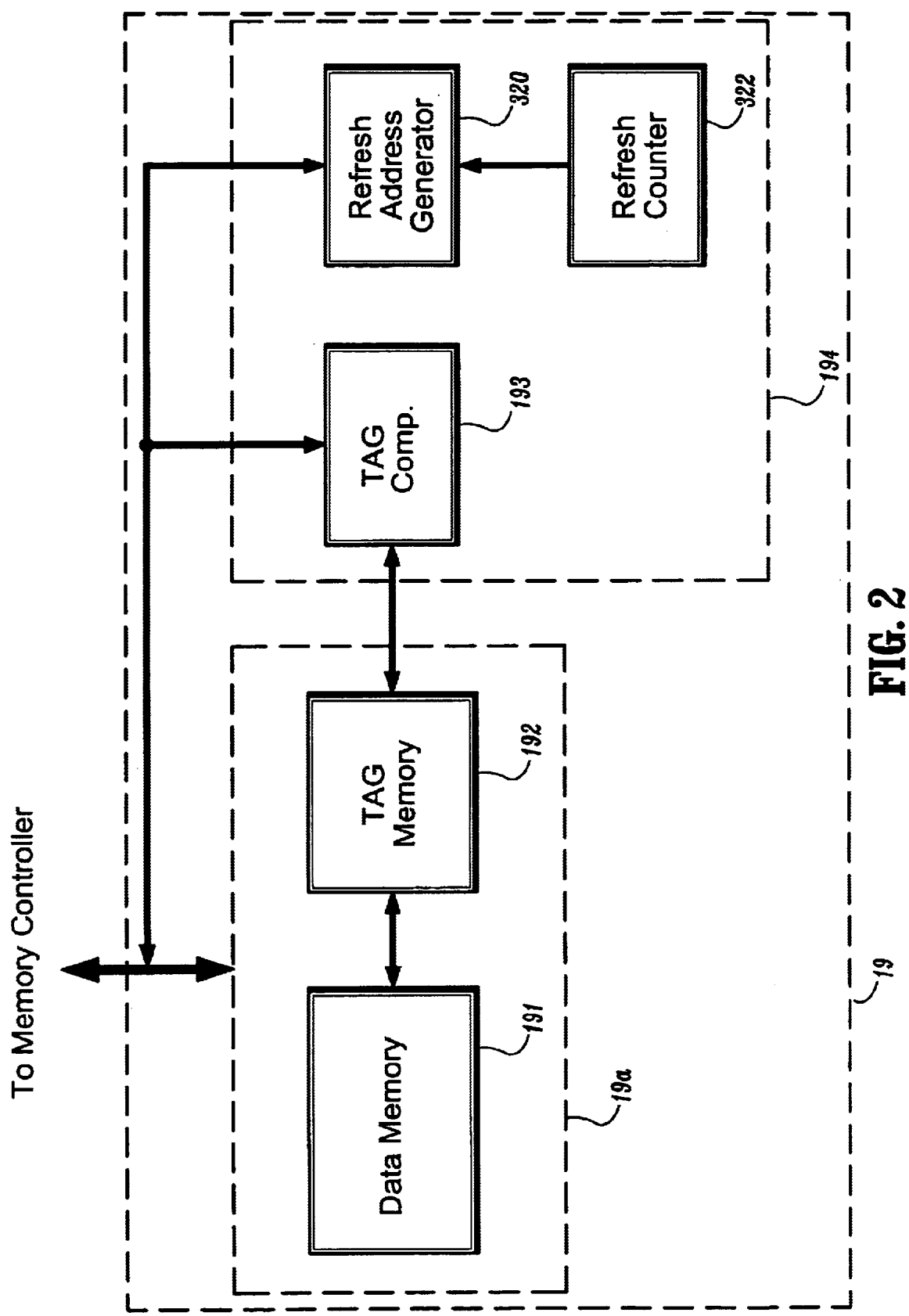
FIG. 2 is a block diagram illustrating a cache memory in FIG. 1.

Referring to FIG. 2, the second level cache memory 19 includes a cache memory 19a comprising a data memory 191 and a TAG memory 192. The data memory 191 stores data with a higher probability of being selected by the CPU (11, referring to FIG. 1), and the TAG memory 192 stores TAG addresses each addressing a corresponding cache line of the data stored in the data memory 191.

As mentioned above, when a "miss" occurs in the first level cache memory (13, referring to FIG. 1), a requested address from the CPU is loaded on the CPU bus (17, referring to FIG. 1) to be transferred to the second cache memory 19. The memory controller (18, referring to FIG. 1) receives the requested address from the CPU bus and sends the requested address to a TAG comparator 193 included in a TAG refresh controller 194. The TAG comparator 193 compares the requested address with TAG addresses provided from the TAG memory 192 of the cache memory 19a. If the requested address is found among the TAG addresses in the TAG memory (i.e., a "hit" occurs), a cache line corresponding to the requested address (or the selected TAG address) is accessed in the data memory 191 by the CPU. If the requested address is not found in the TAG addresses in the TAG memory (i.e., a "miss" occurs), the requested address is sent to the main memory (15, referring to FIG. 1) to find a wordline corresponding to the requested address in the main memory.

The TAG refresh controller 194 is provided for refreshing data stored in the data memory 191 of the DRAM cache memory 19. The TAG refresh controller 194 is used to map a history table to trace memory addresses each requiring a data refresh process. By using the TAG refresh controller 194, no delay may be caused by the data refresh process. To perform the data refresh process, the TAG refresh controller 194 also includes a refresh address generator 320 and a refresh counter 322. A more detailed description of the data refresh process follows.

Figure 3:
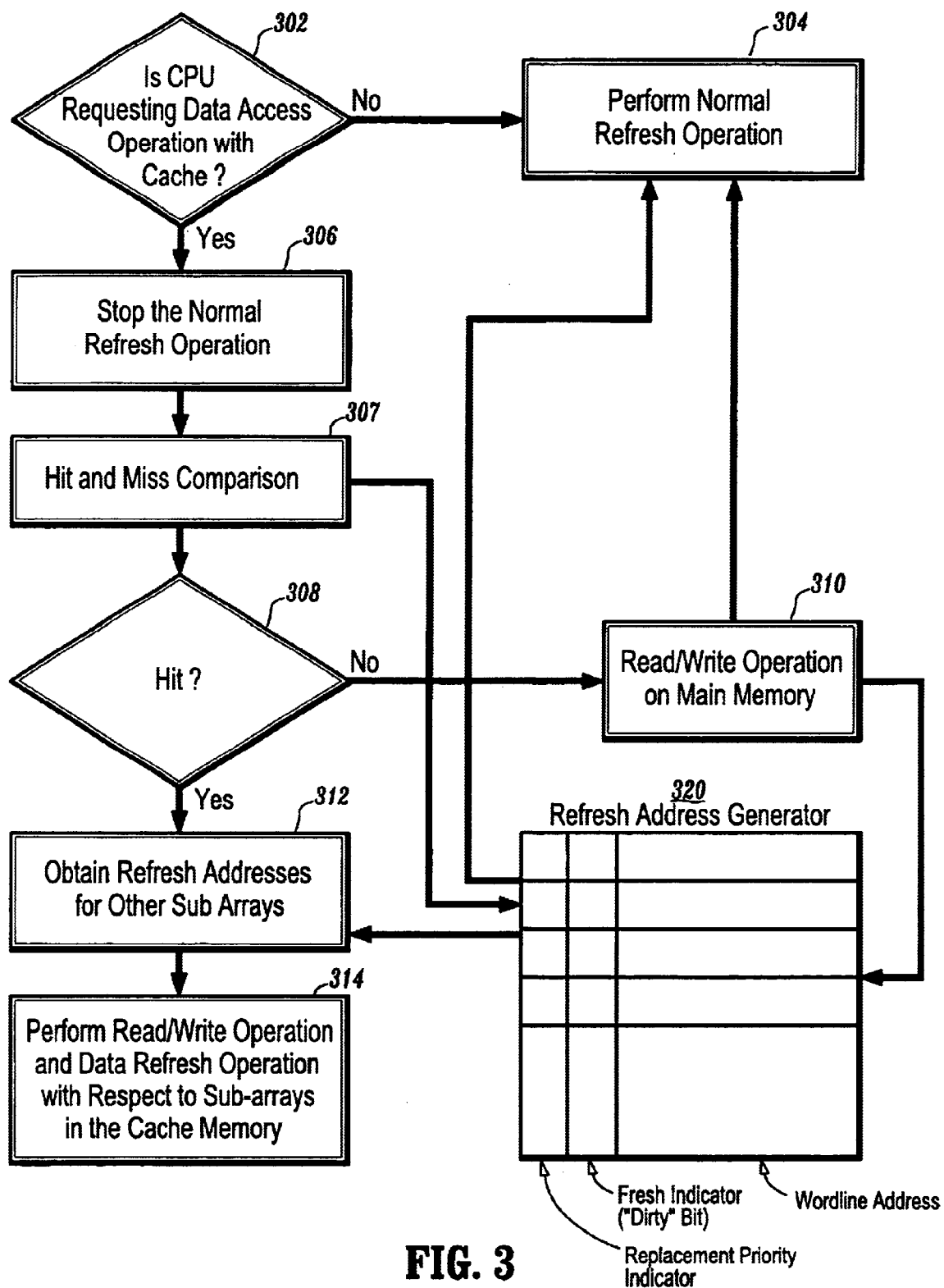
FIG. 3 is a flow chart describing a method of refreshing cache memory according to the present invention.

Referring to FIG. 3, a flow chart illustrates a method of refreshing data in a DRAM cache memory (for example, the second level cache memory 19 in FIG. 1) according to an embodiment of the present invention. It is first determined whether the CPU is requesting a data access operation with the cache (step 302). For instance, as noted above, if a "miss" occurs in a first level cache memory, the requested address is sent to a lower level memory, for example, the second level cache memory. In other words, if the CPU has requested to read or write data on a wordline in the cache memory, the CPU will load an address representing the wordline on a CPU bus. When the CPU is not requesting a data access operation with the cache (negative determination in step 302) (i.e., there is no requested address received from the CPU), a normal data refresh operation is performed on the cache (step 304). In a normal refresh operation, data stored in a cache memory is refreshed in such a way that memory arrays of the cache memory are refreshed in sequence. A refresh address generator 320 which is included in the TAG refresh controller (194, referring to FIG. 2) generates at least one refresh address to refresh data in a corresponding wordline in a sub-array of the cache memory based on a refresh clock provided by the refresh counter (322, referring to FIG. 2). For example, for a certain period of time one word line per each sub-array in the cache memory can be refreshed simultaneously. Therefore, in this case, one refresh address generator may be needed for each sub-array. Generating refresh addresses to sub-arrays in a cache memory is described in detail below referring to FIG. 4.

When the CPU is requesting a data access operation with the cache memory (affirmative determination in step 302), refresh cycles for the normal refresh operation are stopped (step 306). Upon stopping the normal refresh operation with respect to the cache memory, the requested refresh address (es) is/are sent to the TAG refresh controller. The TAG refresh controller controls a "hit and miss comparison" which is performed using the TAG comparator (193, referring to FIG. 2) and the TAG memory (192, referring to FIG. 2) (step 307). In the hit and miss comparison, a "hit" is the case of finding data requested by the CPU in the cache memory, and a "miss" is the case of not finding the requested data in the cache memory and going to a main memory to fetch the data. To determine a "hit" or "miss", the TAG comparator compares the CPU requested address(es) with TAG addresses stored in the TAG memory, and determines whether the requested address(es) are found among the TAG addresses.

Upon performing the "hit and miss comparison", if the CPU requested address(es) are not found among the TAG addresses in the TAG memory (i.e., there is no "hit" in step 308), the requested address(es) are sent to a main memory to fetch the data. Using a requested address representing a wordline in the main memory, a memory controller (18, referring to FIG. 1) accesses the wordline to perform a read/write operation requested by the CPU on the wordline in the main memory (step 310). Upon performing the read/write operation, the memory controller controls the cache to perform the normal refresh operation with respect to the cache memory (step 304). In addition, the memory controller sends to the refresh address generator 320 the address(es) where the read/write operation is performed, so that data stored in these addresses do not have to be refreshed again.

Upon performing the "hit and miss comparison", if a CPU requested address is found among the TAG addresses in the TAG memory (i.e., there is a "hit" in step 308), the refresh address generator 320 generates refresh addresses of sub-arrays in the cache memory other than the sub-array having the requested address (step 312). The cache memory has multiple sub-arrays, and data in each sub-array may be addressed by different wordline addresses. When there is a "hit", a wordline in a sub-array of the cache memory may be accessed with the requested address (or the selected TAG address). In that case, the requested address becomes an access address to access the corresponding wordline in the sub-array. Also, when there is a "hit", the refresh address generator 320 generates the refresh addresses to refresh data in other sub-arrays of the cache memory than the sub-array having the wordline for the read/write operation by the CPU. Each of the refresh addresses may address a wordline in each of the sub-arrays to be refreshed (this will be described in detail referring to FIG. 4).

The refresh address generator 320 stores, for example, priority indicators, fresh indicators, and wordline addresses such that each wordline address has a corresponding priority indicator and fresh indicator. A priority indicator indicates priority of replacement of the corresponding wordline address in the refresh address generator 320. A fresh indicator provides an indication of data reliability (i.e., "dirty" bit or non-valid bit). A wordline address is the same address as one in the cache memory on which read/write operation requested by the CPU is performed under control of the memory controller.

Upon obtaining the refresh addresses from the refresh address generator 320 (step 312), the read/write operation requested by the CPU and a data refresh operation are simultaneously performed in the cache memory using the requested address (i.e., access address) from the CPU and the internally generated refresh addresses, respectively (step 314). The data refresh operation is performed with respect to sub-arrays in the cache memory other than the sub-array where data corresponding to the access address is stored. In performing the read/write and data refresh operations in the cache memory, a process of accessing data in the access address in a sub-array is performed simultaneously with a process of refreshing data corresponding to each of the refresh addresses which are respectively provided to sub-arrays other than the sub-array to which the access address is provided. As a result, a delay that is caused by the data refresh requirement in the prior art can be significantly reduced or completely eliminated.

Figure 4:
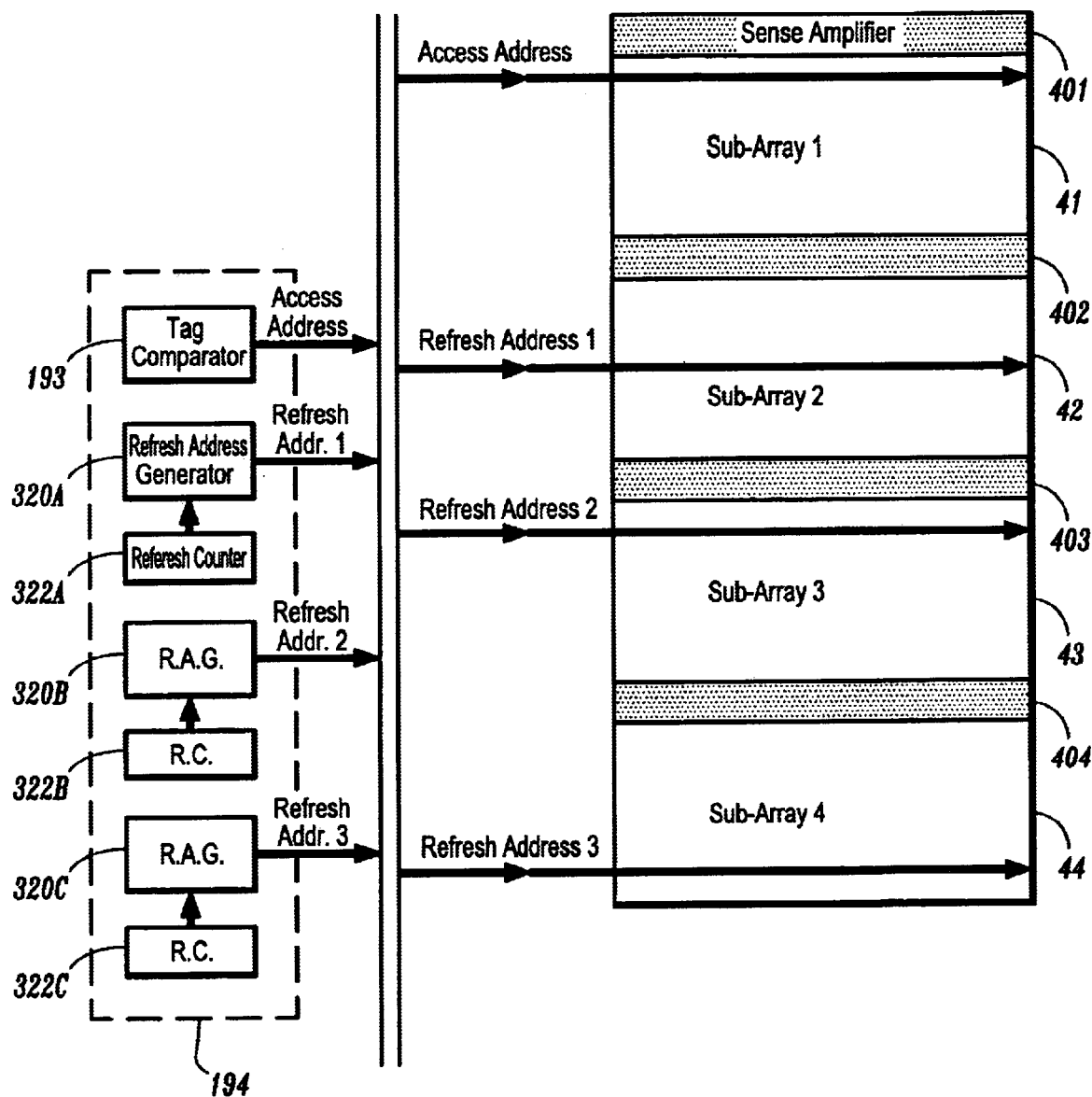
FIG. 4 is a block diagram illustrating sub-arrays of a cache memory and a data refresh operation according to the present invention.

Referring to FIG. 4, there is provided a block diagram illustrating a configuration of a cache memory and wordline addresses applied to the cache memory. A DRAM cache memory may have multiple sub-arrays each having a sense amplifier. Data stored in each of the sub-arrays may be accessed by a corresponding wordline address. For example, a cache memory in FIG. 4 has four sub-arrays 41–44 each of which has a sense amplifier bank 401–404. Assuming that a wordline on which read/write operation requested by a CPU is to be performed is located in a first sub-array 41, the access address corresponding to the wordline is provided to the first sub-array 41. At the same time, the refresh address generators 320A–320C generate first through third refresh addresses to the second through fourth sub-arrays 42–44, respectively. While a corresponding wordline is accessed with the access address in the first sub-array 41 to perform the read/write operation requested by the CPU, corresponding wordlines in the second through fourth sub-arrays 42–44 are respectively accessed with the first through third refresh addresses to refresh data of the corresponding wordlines. In other words, in the data refresh operation, one word line data in each of the second through fourth sub-arrays 42–44 of the cache memory is accessed with each of the first through third refresh addresses. For example, the first through third refresh address generators 320A–320C included in the TAG refresh controller 194 receive a refresh clock from the first through third refresh counters 322A–322C, respectively, and generate the first through third refresh addresses to the second through fourth sub-arrays 42–44, respectively. In the case of four sub-arrays 41–44, each sub-array is identified, for example, by the first two digits of an address to access a wordline in the sub-array. In other words, the first two digits of a wordline address may be '00', '01', '10', or '11', which designates the first sub-array 41, second sub-array 42, third sub-array 43, or fourth sub-array 44, respectively.

In the read/write operation, word line data in the first sub-array 41 is accessed with the access address, and a refresh address that has been generated to refresh the first sub-array 41 must be held until a next available moment to perform a refresh operation. In other words, a data refresh process may be performed in the first sub-array 41 when the CPU accesses any of the other three sub-arrays 42–44. However, only data which are in a refreshable condition may be refreshed by the refresh addresses provided by the refresh address generator. If the CPU continuously accesses a certain portion of the first sub-array 41 for a prolonged period of time, then data stored in the remaining portion of the first sub-array 41 will become "dirty", so that the data must be replaced from main memory when they are needed by the CPU. That is, data must be copied back from a main memory for those data which are aged and are in a non-refreshable condition. However, the probability of such highly uneven access with respect to multiple sub-arrays is rare.

A refresh address generator 320 may preferably include a refresh counter 322 which provides refresh timing and addresses of wordlines for each sub-array in which refresh operation is to be performed. The refresh counter 322 is, for example, tracking the wordline addresses for each sub-array to be refreshed. When one wordline data is refreshed, the refresh counter 322 generates the next address of the sub-array for refresh. When all the wordlines in the sub-array are refreshed, the refresh counter 322 will be reset to zero and starts to refresh the first wordline again in the next refresh cycle. Addresses of wordlines with a "dirty bit" which have not been refreshed or accessed for a predetermined time period, are also recorded in the TAG memory and are refreshed by transferring data from main memory when the cache memory does not actively perform read/write operation. Since timing information for each wordline address is tracked and recorded, wordline addresses with a "dirty bit" can be detected. Then, data of the dirty wordline addresses are refreshed by sending a signal to "clean" the dirty data of the wordline address with data from a main memory. The dirty data to be cleaned are in sub-arrays other than a sub-array where data is accessed according to a request by a CPU.

Assuming that a DRAM cache memory has 'n' sub-arrays each of which stores data accessed by wordline addresses, a read/write operation is performed with respect to a sub-array and a data refresh operation can be performed with respect to 'n-1' sub-arrays simultaneously. In other words, no extra time period is required to perform the data refresh operation with respect to the 'n-1' sub-arrays in the cache memory. Therefore, the time required for a data refresh operation in the DRAM cache memory will not cause any delay in CPU.

Having described a method for refreshing data in DRAM cache memory without refresh penalty, modifications and variations can be readily made by those skilled in the art in light of the above teachings. It is therefore to be understood that, within the scope of the appended claims, the present invention can be practiced in a manner other than as specifically described herein.

What is claimed is:

1. A method for refreshing data in a cache memory, comprising the steps of:

verifying a request address received from a processor using TAG addresses associated with the cache memory, said cache memory comprising a plurality of memory sub-arrays; and if the request address is verified, accessing a wordline corresponding to the request address in one of the plurality of sub-arrays of the cache memory to perform a data access operation; and generating refresh addresses for performing a refresh operation to refresh data stored in each of the sub-arrays other than the one sub-array in which said data access operation is performed, wherein each of the refresh addresses addresses a wordline in a corresponding one of the plurality of sub-arrays other than the one sub-array in which said data access operation is performed and wherein each of the refresh addresses includes a priority indicator representing priority of replacement of data corresponding to that refresh address, and a wordline address to address a wordline in a corresponding sub-array of the cache memory.

2. The method as defined in claim 1, wherein the data access operation and the refresh operation are performed simultaneously.

3. The method as defined in claim 1, wherein performing the refresh operation comprises using the refresh addresses to simultaneously access wordlines in the plurality of sub-arrays other than the one sub-array, wherein each of the refresh addresses is associated with a corresponding one of the plurality of sub-arrays other than the one sub-array.

4. The method as defined in claim 1, wherein each of the refresh addresses further includes a fresh indicator indicating reliability of data corresponding to that refresh address.

5. The method as defined in claim 1, wherein the verifying of the request address comprises:
storing TAG addresses in a TAG memory of the cache memory, each TAG address being associated with a corresponding wordline data stored in the cache memory;
comparing the request address with the TAG addresses; and
selecting a TAG address identical with the request address.

6. The method as defined in claim 5, further including performing a normal refresh operation with respect to data in the cache memory when the request address is different from the TAG addresses in the TAG memory.

7. The method as defined in claim 1, wherein performing the refresh operation comprises using a counter to provide data refresh timing and refresh addresses for each of the plurality of sub-arrays other than the one sub-array.

8. The method as defined in claim 7, wherein a separate counter is used for each sub-array.

9. A method for refreshing data in a cache memory, comprising the steps of:
detecting a request address received from a processor;
stopping a normal refresh operation of the cache memory when the request address is detected, said cache memory comprising a TAG memory and a data memory having a plurality of sub-arrays;
comparing the request address with addresses stored in the TAG memory;
if the request address is identical to an address in the TAG memory,
performing a data access operation in a sub-array of the cache memory by accessing a wordline in the sub-array corresponding to the request address while simultaneously performing a refresh operation for other sub-arrays of the cache memory in which the data access operation is not performed, wherein performing the refresh operation comprises generating refresh addresses to refresh stored data in the other sub-arrays of the cache memory based on an age of the stored data; and
if the request address is not identical to an address in the TAG memory, continuing the normal refresh operation of the cache memory,
wherein each of the refresh addresses includes a priority indicator representing priority of replacement of data corresponding to that refresh address, and a wordline address to address a wordline in a corresponding sub-array of the cache memory.

10. The method as defined in claim 9, wherein the generating of refresh addresses to refresh stored data in the other sub-arrays of the cache memory based on an age of the stored data, comprises:
outputting refresh addresses for data that is determined to require refreshing and is in refreshable condition; and
replacing data that is determined to require refreshing and is in a non-refreshable condition by copying back corresponding data from another memory.

11. An apparatus for refreshing data in a cache memory, comprising:
a memory controller for detecting a request address;
a comparator for comparing the request address detected by the memory controller with addresses associated with data stored in the cache memory comprising a plurality of sub-arrays, wherein when the comparator finds an address that is identical to the request address, a data access operation is performed in a sub-array under control of the memory controller by accessing a wordline in the sub-array corresponding to the request address; and
a refresh controller for controlling a refresh operation of data stored in the sub-arrays of the cache memory, wherein the refresh controller generates refresh addresses to refresh data stored in other sub-arrays of the cache in which the data access operation is not performed, while the data access operation is performed, and wherein the refresh controller maintains a priority indicator for a refresh address representing priority of replacement of data corresponding to that refresh address, and a wordline address to address a wordline in a corresponding sub-array of the cache memory.

12. The apparatus as defined in claim 11, wherein the refresh controller provides the refresh addresses to the other sub-arrays at the same time that the request address is provided to the sub-array in which the data access is performed.

13. The apparatus as defined in claim 11, wherein the comparator receives TAG addresses from a TAG memory in the cache memory, each of the TAG addresses being associated with a portion of data stored in a data memory of the cache memory.

14. The apparatus as defined in claim 13, wherein the data memory of the cache memory stores data having a higher probability of being selected by the processor than other data.

15. The apparatus as defined in claim 11, wherein the refresh controller includes a plurality of refresh address generators for generating the refresh addresses, wherein each of the refresh address generators is associated with a corresponding one of the sub-arrays and generates a refresh address to refresh data stored in the corresponding one of the sub-arrays.

16. The apparatus as defined in claim 15, further comprising a plurality of refresh counters, wherein each of the plurality of refresh address generators is operatively coupled to a corresponding one of the plurality of refresh counters to provide refresh timing for corresponding ones of the sub-arrays.

17. The apparatus as defined in claim 16, wherein each refresh counter is reset to an initial value when data in a sub-array corresponding to that refresh counter is refreshed.

* * * * *